United States Patent [19]

Tanji et al.

[11] 4,314,215
[45] Feb. 2, 1982

[54] SURFACE ACOUSTIC WAVE FILTER DEVICE WITH EQUALIZATION OF STRAY COUPLING

[75] Inventors: Shigeo Tanji, Yokohama; Noboru Wakatsuki, Kawasaki; Hideki Tominaga, Suzaka, all of Japan

[73] Assignee: Fujitsu Limited, Kawasaki, Japan

[21] Appl. No.: 168,324

[22] Filed: Jul. 11, 1980

[30] Foreign Application Priority Data

Jul. 20, 1979 [JP] Japan .................. 54-92292

[51] Int. Cl.³ .............. H03H 9/64; H03H 9/25; H03H 9/145; H03H 9/42
[52] U.S. Cl. .............. 333/193; 310/313 R; 333/151; 333/194
[58] Field of Search .............. 333/150-155, 333/193-196; 310/313 R, 313 A, 313 B, 313 C; 330/3.5; 358/36, 155, 156, 167, 201, 905

[56] References Cited

U.S. PATENT DOCUMENTS

| | | | |
|---|---|---|---|
| 3,878,407 | 4/1975 | Hartemann et al. | 333/154 X |
| 4,126,839 | 11/1978 | Yamanoi et al. | 333/194 |
| 4,237,432 | 12/1980 | Huang et al. | 333/194 |
| 4,250,473 | 2/1981 | Gemba | 333/193 |

Primary Examiner—Marvin L. Nussbaum

[57] ABSTRACT

A surface acoustic wave filter device in which a capacitative coupling means is provided to couple at least one of the terminals of the SAW input transducer to at least one of the terminals of the output transducer, in order to equalize the levels of signals which are induced on the pair of output terminals of said output transducer without assuming the form of surface acoustic waves. The stray inductive coupling which normally occurs between the input and output terminals of the SAW filter degrades filter performance. Since the inductive coupling to the two output terminals is normally unequal, the inductively coupled unfiltered signals cannot be completely rejected by a balanced differential amplifier. By equalizing the levels of unfiltered signals at the output terminal, effective rejection by a differential amplifier is possible.

9 Claims, 29 Drawing Figures

Fig. 8A  Fig. 8B  Fig. 8C
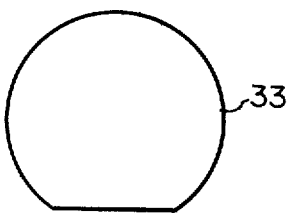
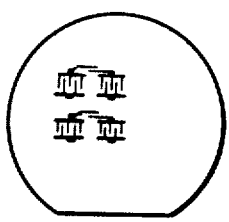
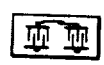
Fig. 13
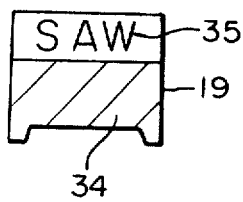

SURFACE ACOUSTIC WAVE FILTER DEVICE WITH EQUALIZATION OF STRAY COUPLING

BACKGROUND OF THE INVENTION

The present invention relates to a surface acoustic wave filter device which effectively serves as a very small filter for use in electronic circuits.

A surface acoustic wave filter device comprises a filter chip providing an input transducer and an output transducer having forms which each comprise a pair of comb-shaped electrodes on a piezo-electric substrate, and a case which accommodates a filter chip. A radio-frequency voltage is applied to the input transducer which generates acoustic waves, and the acoustic waves thus generated are received by the output transducer and are converted into electric signals, so that a filtering function such as band-pass is embodied by means of the input and output transducers. The application of the input voltage to the input transducer is carried out by connecting a wire to an externally leading electrode of the input transducer via an external input signal leader terminal attached to the case, and the transmitting out of the output voltage from the output transducer is carried out by connecting a wire to an external output signal leader terminal attached to the case via an externally leading electrode of the output transducer. When such a surface acoustic wave filter is used for a television receiver, especially for an intermediate-frequency circuit of a television receiver, only signals within a particular frequency band, determined by the shapes of the electrodes of the input and output transducers, are allowed to propagate from the input transducer to the output transducer, i.e., only signals of an intermediate frequency are allowed to propagate in the form of surface acoustic waves from the input transducer to the output transducer. In practice, however, it was revealed that signals produced at the output terminals (which include the external leader terminal attached to the case for the input signal, the externally leading electrode of the input transducer on the filter chip, and the wire connected between said externally leading electrode of the input transducer and said external leader terminal) of the surface acoustic wave filter device, within a television receiver, contained signal components which had not assumed the form of acoustic surface waves, but which had been directly transmitted by inductive coupling. The induced field directly propagates from the circuitry external to the surface acoustic wave filter device to the output terminals (which include the external leader terminal attached to the case for the input signal, the externally leading electrode of the input transducer on the filter chip, and the wire connected between said externally leading electrode of the input transducer and said external leader terminal) of the surface acoustic wave filter device due to the principle of electromagnetic induction. When the output terminals of the surface acoustic wave filter are connected to the input terminals of a differential amplifier, the difference in the level of signal components induced on the two input terminals becomes a problem. Namely, when the levels of inductive coupling in the two input terminals of the differential amplifier are the same, the signal levels cancel each other through the differential amplifier and no difference appears in the output. However, when there is a difference in the levels which are induced, the difference is not cancelled but appears in the output. That is to say, an increase in the induced components results in increased ripple in the pass-band characteristics of the surface acoustic wave filter device, so that the attenuation of the rejection band decreases and the characteristics of the filter deteriorate.

To eliminate the defects caused by induction, as described above, the whole surface acoustic wave filter device, including the filter chip and the input and output terminals of the chip, should be shielded. The filter chip can be shielded if the filter chip is housed in a metal case, but the external leader terminals which are portions of the input and the output terminals cannot be completely shielded, because the external leader terminals must protrude from the metal case for the purpose of connecting the filter device to the external circuit. Further, if the external leader terminals are shielded by using a shield plate, etc., the number of the parts used in the device increases and the assembly of the parts is troublesome, so that the cost of the device increases. Further, since the induction is developed not only by the external terminal leader but also by various other members, the above attempt at shielding encounters a variety of difficulties.

SUMMARY OF THE INVENTION

The object of the present invention is to provide a surface acoustic wave filter device which can be used as a very small filter for electronic circuits, and which works to cancel the effects of inductive coupling which directly reaches the output terminals of the acoustic surface wave filter device from external units.

Another object of the present invention is to provide surface acoustic wave filter device in which the amount of inductive coupling of the output terminal which has the smaller level of coupling is increased to equalize the levels of inductive coupling into both output terminals, or, strictly speaking, to equalize the inductively coupled signal levels applied to the two input terminals of a differential amplifier which is installed in a subsequent stage, such that the inductively coupled signals are cancelled by the differential amplifier.

In order to accomplish the above-mentioned objects, the present invention deals with a surface acoustic wave filter device in which a filter chip, including an input transducer and an output transducer composed of a pair of interdigitated electrodes formed on a piezo-electric substrate, is accommodated in a casing which has a plurality of externally leading terminals; a radio-frequency voltage is applied to the input transducer through the externally leading input terminals, and electric outputs of the output transducer are introduced into a balanced-type, differential amplifier through the externally leading output terminals. The coupling of least one of a pair of input terminals of the input transducer to at least one of a pair of output terminals of the output transducer is increased, so as to equalize the levels of signals which are inductively coupled into the pair of output terminals of the output transducer without having assumed the form of surface acoustic waves.

Further features and advantages of the present invention will be apparent from the ensuing description with reference to the accompanying drawings to which, however, the scope of the invention is not limited.

BRIEF DESCRIPTION OF THE DRAWING

FIGS. 8A, 8B and 8C are diagrams illustrating the steps for producing a surface acoustic wave filter chip according to the present invention;

FIG. 13 is a diagram of another embodiment of the surface acoustic wave filter device according to the present invention.

DESCRIPTION OF THE PREFERRED EMBODIMENTS

Figure 1A:
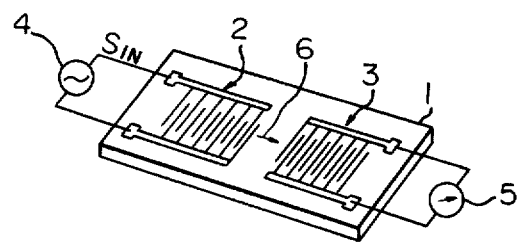
FIG. 1A and FIG. 1B are perspective views illustrating two conventional surface acoustic wave filter chips.

Referring to FIG. 1A, which illustrates a conventional surface acoustic wave filter chip, an input transducer 2 and an output transducer 3, each of which is composed of two separate, interdigitated comb-shaped electrodes, are formed on the surface of a piezo-electric substrate 1. When an electric signal from a tracking generator 4 is applied to the two electrodes of the input transducer 2, the electric signal is converted into a surface acoustic wave 6, which is converted into another electric signal by the output transducer 3 which is connected to a load impedance 5. In this case, the frequency of surface acoustic wave 6 is determined by the spacing of the electrodes of the input transducer 2, which is the same as that of the output transducer 3.

Figure 1B:
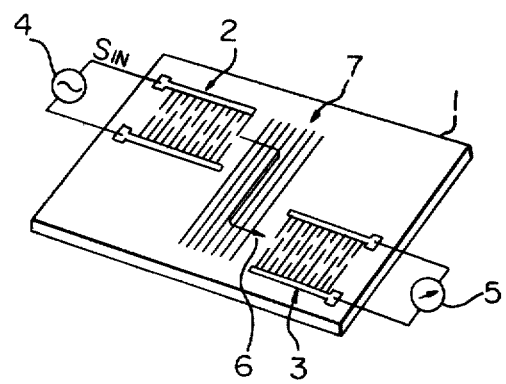

A surface acoustic wave filter chip as illustrated in FIG. 1B is different from the chip illustrated in FIG. 1A in the following point. That is, in the surface acoustic wave filter chip illustrated in FIG. 1B, a multi-strip coupler 7 which is formed by a plurality of parallel metal conductors is provided between the input transducer 2 and the output transducer 3, so that in the filter chip shown in FIG. 1B, the bulk wave effect is small as compared to the filter chip shown in FIG. 1A, and the characteristics of the filter are therefore improved.

Further, as illustrated in FIG. 1B, the construction of the input transducer 2 and the output transducer 3 of the filter chip which has the multi-strip coupler 7 is different from the construction of the corresponding parts of the filter chip illustrated in FIG. 1A. That is, each electrode of a pair of interdigitated comb-shaped electrodes is positioned at a predetermined distance, and the length of each electrode is varied so as to weight the transducer. Each of the filter chips illustrated in FIGS. 1A and 1B forms a band-pass filter.

Figure 2A:
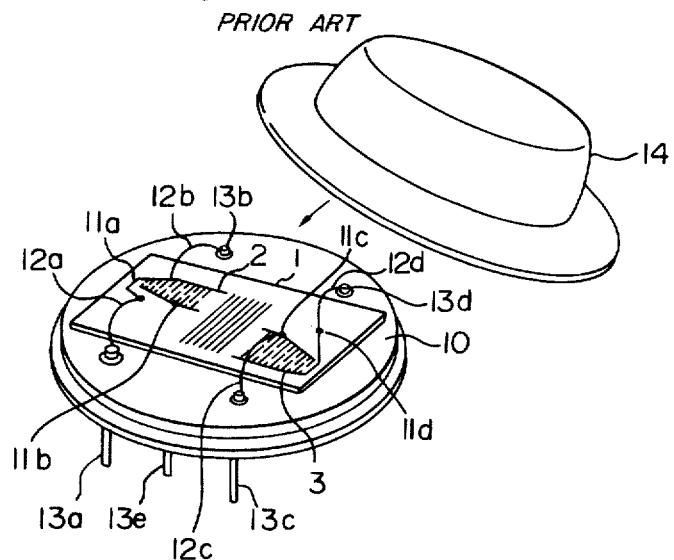
FIG. 2A and FIG. 2B are diagrams illustrating some ways in which the surface acoustic wave filter chip of FIG. 1B is mounted.
Figure 2B:
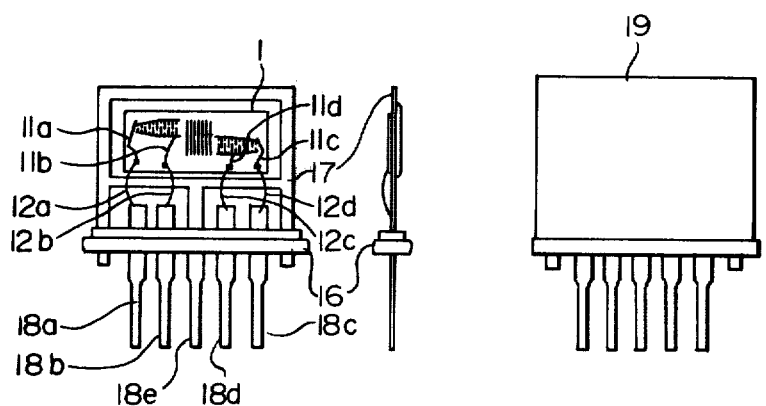

FIGS. 2A and 2B illustrate ways in which a surface acoustic wave filter chip of the multi-strip coupler type (hereinafter referred to as MSC) illustrated in FIG. 1B is mounted. FIG. 2A illustrates an example in which a metallic casing is used. The surface acoustic wave filter chip 1 of FIG. 1B is mounted on a metallic stem 10, and wirings 12a, 12b, 12c and 12d, which are taken out from the leading electrodes 11a, 11b, 11c, and 11d of the transducers 2 and 3, are connected to external leader terminals 13a, 13b, 13c, and 13d, which are mechanically fastened to the metallic stem 10 in an insulated manner. The metallic stem 10 is connected to an external leader terminal 13e. The filter chip 1 is mounted on the metallic stem 10, each comb-shaped electrode of the transducers 2 and 3 is connected to one of the external leader terminals 13a, 13b, 13c and 13d, and the substrate 1 is sealed by a metallic cap 14. FIG. 2B illustrates an example in which a mounted casing is used. The filter chip 1 is first mounted on a metallic stem 17 which is molded on a molded substrate 16 of the SIP type (single inline package type). The leading electrodes 11a, 11b, 11c, and 11d of the transducers 2 and 3 are connected to external leader terminals 18a, 18b, 18c and 18d via the wirings 12a, 12b, 12c, and 12d. Unnecessary portions are cut away and then a molded cap 19 is fitted thereon. The metallic stem 17 is connected to an external leader terminal 18e and is grounded.

Figure 3:
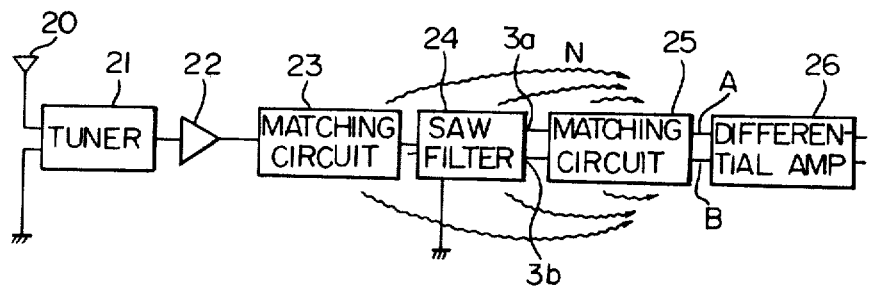
FIG. 3 is a block diagram illustrating portions of a television receiver which employs a surface acoustic wave (SAW) filter device.
Figure 4:
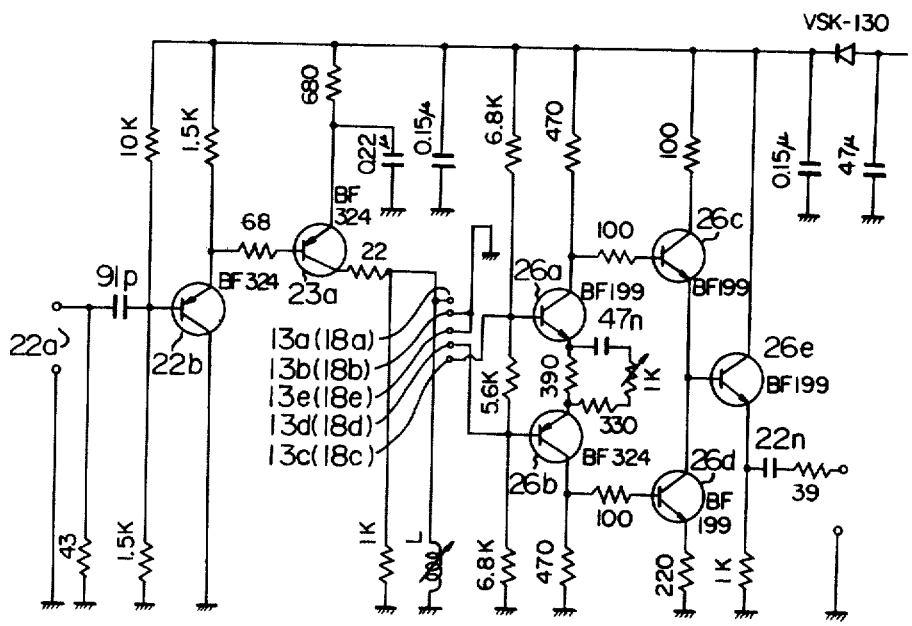
FIG. 4 is a circuit diagram of the auxiliary circuit surrounding the surface acoustic wave filter device in the block diagram of FIG. 3.

The above-mentioned surface acoustic wave filter device is disposed, for example, as illustrated in FIG. 3 when it is used for a television receiver. FIG. 3 illustrates a general formation when the surface acoustic wave filter device is used in an intermediate-frequency amplification stage. Reference numeral 20 denotes an antenna, 21 denotes a tuner, 22 denotes a pre-amplifier, 23 denotes a matching circuit, 24 denotes a surface acoustic wave filter device, 25 denotes another matching circuit, and 26 denotes a differential amplifier. The intermediate-frequency amplification stage will be followed by an intermediate-frequency detector and other conventional elements. FIG. 4 illustrates in detail a portion of the circuit of FIG. 3, in which reference numeral 22a denotes an input terminal of the pre-amplifier 22, 22b denotes a transistor of the pre-amplifier 22, 23a denotes a transistor which forms the matching circuit 23, reference numerals 13a(18a), 13b(18b), 13c(18c), 13d(18d) and 13e(18e) denote external leader terminals of the filter device 24 as illustrated in FIG. 2A or 2B, and reference numerals 26a, 26b, 26c, 26d and 26e denote transistors which form the differential amplifier 26.

In the circuit of FIG. 3, the surface acoustic wave filter device 24 passes signals of a particular frequency band determined by the configuration of electrodes (the number of pairs of interdigitated comb-shaped electrodes, the spaces of the electrodes, and the weighting value), and only permits signals near the intermediate-frequency to propagate in the form of surface acoustic waves from the input transducer 2 to the output transducer 3 (FIG. 1). Here, however, it has been discovered that outputs produced on output terminals 3a and 3b contain signal components N which have directly reached the output terminals 3a, 3b by induction, without having assumed the form of surface acoustic waves.

Figure 5A:
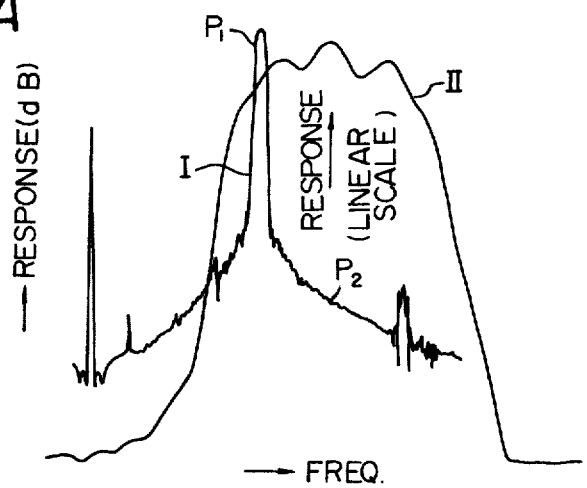
FIG. 5A and FIG. 5B are diagrams illustrating frequency characteristics of conventional surface acoustic wave filter devices.

FIG. 5A illustrates an output wave-form of the differential amplifier 26. As is obvious from FIG. 5A, an output wave-form I contains a peak portion $P_1$ and a skirt portion $P_2$. If illustrated on an enlarged scale, the peak portion $P_1$ assumes a shape as illustrated by a wave-form II. In FIG. 5A, the abscissa represents a frequency and the ordinate represents a response. The response is indicated on a decibel scale for the wave-form I and on a linear scale for the wave-form II. Experiment teaches that when the difference of the signal levels inductively coupled into the output terminals $3a$ and $3b$ increases, the attenuation level in the skirt portion $P_2$ decreases and ripples increase in the peak portion $P_1$ with the increase in induction in the skirt portion $P_2$. Wave-form II of FIG. 5A shows frequency characteristics in the pass-band of the filter. The characteristics in FIG. 5A show decreased out of-band attenuation, and undesirable ripples in the pass-band.

Figure 5B:
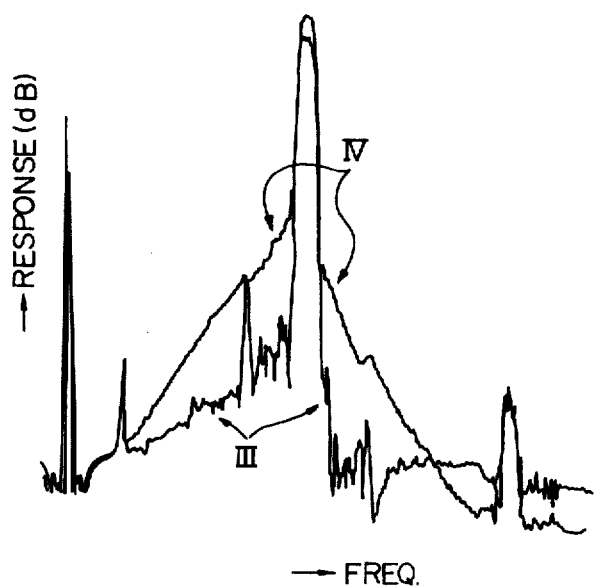

The phenomenon of inductive coupling is discussed below with reference to FIG. 4 in conjunction with FIG. 5B. In FIG. 5B, a curve III represents the output wave-form when the external leader $13d(18d)$ terminal of the filter device of FIG. 4 is grounded and only the external leader terminal $13c(18c)$ is connected to the differential amplifier 26, and curve IV represents the output wave-form when the external leader $13c(18c)$ is grounded and the output of only the external leader terminal $13d(18d)$ is fed to the differential amplifier 26. As is seen in FIG. 5B, there exists a difference in level between the wave-form III and the wave-form IV. Although most of the signals S from the input terminal $22a$ of FIG. 4, are transmitted to the differential amplifier 26 via the surface acoustic wave filter device 24, portions of the signal components (denoted by N in FIG. 3) are directly transmitted by electromagnetic coupling to the external leader terminals $13d(18d)$ and $13c(18c)$ of the acoustic surface wave filter device 24 (i.e., portions of the signal components N are transmitted to the two input terminals of the differential amplifier 26). In this case, a problem arises with regard to the different levels of signal components A and B (FIG. 3) which are induced on the external leader terminals $13c(18c)$ and $13e(18e)$ of the acoustic surface wave filter 24. Namely, when the levels of the induced signal components A and B are the same, such levels are cancelled through the differential amplifier 26 and do not appear on the output side. However, when there is a difference in the levels of the induced components as shown in FIG. 5B, the difference is not cancelled, and the level of output induction assumes a great value as shown in FIG. 5A. When the levels induced on the external leader terminals $13d(18d)$ and $13c(18c)$ are equal to each other, the two levels are cancelled through the differential amplifier 26 (of the type having balanced input), and the level of output terminal induction becomes lesser.

According to the present invention, the amount of induction on the output side having a small level of induction is intentionally increased, so that the induction levels of the two output terminals are equalized, that is, so that the induction levels applied to the two input terminals of the differential amplifier are equalized the inductively coupled signals are cancelled through the differential amplifier. In the present invention, for the purpose of achieving the desired increase in induction, at least one of the input terminals and one of the output terminals of the surface acoustic wave filter device is coupled. Two embodiments of such coupling, namely that carried out between the input terminal and the output terminal in the filter chip; and that carried out on the outside of the filter chip, will be explained. FIGS. 6A through 6D and FIGS. 7A through 7D illustrate two different embodiments of the present invention, in which corresponding portions of the above-mentioned devices of the prior art are denoted by the same reference numerals.

FIGS. 6A to 6D illustrate embodiments when the present invention is applied to a surface acoustic wave filter chip like that illustrated in FIG. 1A, and FIGS. 7A to 7D illustrate embodiments when the present invention is applied to a filter chip like that illustrated in FIG. 1B. In these embodiments, a common feature is that an electrically conductive pattern 30 (made of aluminum or the like) extends from the externally leading electrode $11c$ or $11d$, which is a portion of the output terminal and in which the induction level is to be increased, and is positioned close to an electrically conductive pattern 31 which extends from the externally leading electrode $11a$ or $11b$, which is a portion of the input terminal on the side (non-grounded side) whence the signals are to be induced, to form a capacitor 32 between the two patterns 30 and 31. The electrically conductive patterns 30 and 31 are formed on a wafer 33 of FIG. 8A together with the input transducer 2 and output transducer 3. In FIG. 8A, the wafer 33 consists of an piezo electric substrate $33a$ and an electrically conductive thin film $33b$ such as aluminum which is formed on the piezo electric substrate $33a$ by using an evaporation (or sputtering) process. The capacitor 32 is formed at the same time that the transducers 2 and 3 are formed as illustrated in FIG. 8B. That is, a photo-sensitive film (not shown) is attached and formed on the electrically conductive thin film $33b$, and this photo-sensitive film is exposed by using an exposure mask (not shown) so as to form the transducers 2 and 3 and the condenser 32 on the piezo electric substrate $33a$. Next, the unnecessary portions of the film $33b$ are etched. FIG. 8C illustrates the state in which the transducers are diced.

Figure 6A:
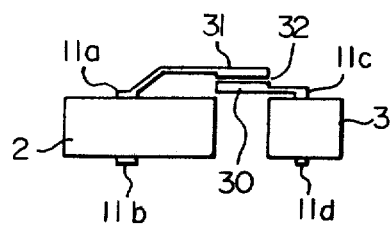
FIGS. 6A, 6B, 6C and 6D and FIGS. 7A, 7B, 7C and 7D are diagrams illustrating surface acoustic wave filter chips according to various embodiments of the present invention.
Figure 6B:
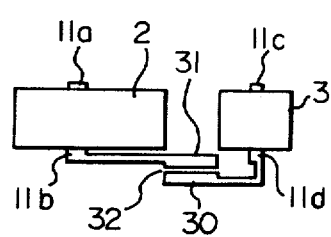
Figure 6C:
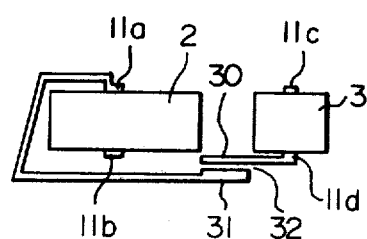
Figure 6D:
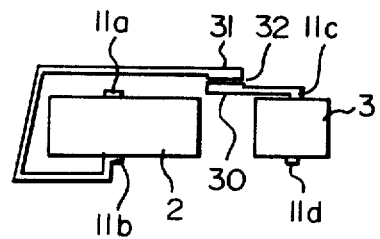
Figure 7A:
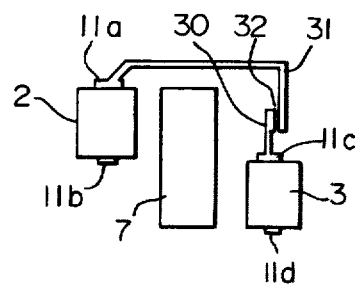
Figure 7B:
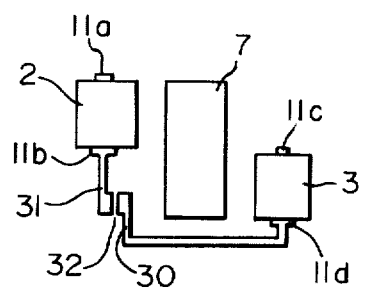
Figure 7C:
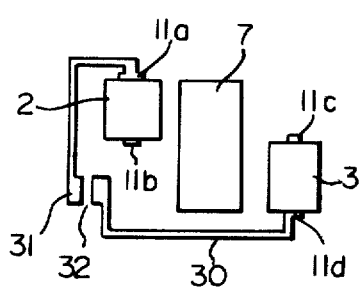
Figure 7D:
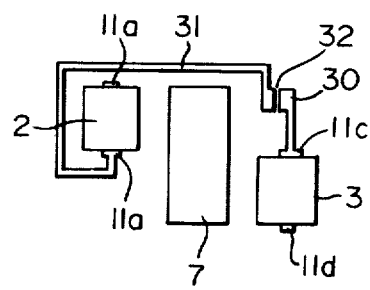
Figure 9A:
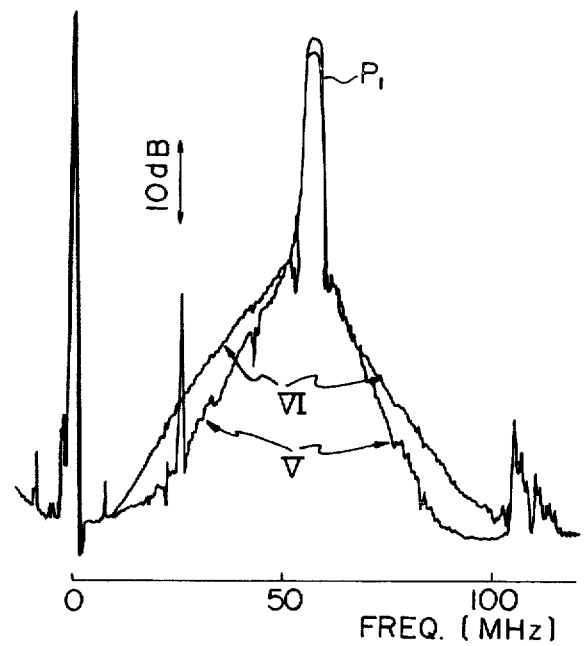
FIGS. 9A and 9B are diagrams illustrating frequency characteristics of an acoustic surface wave filter device according to the present invention.
Figure 9B:
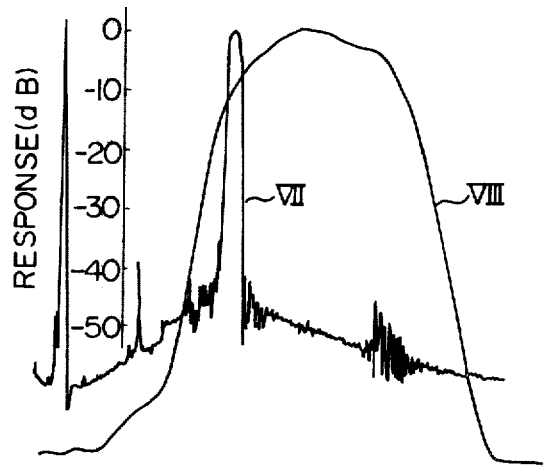

The location for forming the capacitor 32, and the desired value of its capacitance are determined depending upon the terminal in which the level of induction is to be increased and depending upon the amount by which induction is to be increased. Prior to forming the patterns 30 and 31, therefore, the induction levels of the output terminals $3a$ and $3b$ of the filter device illustrated in FIG. 3 must be measured. This can be done in the following way. First, a test filter device (such as is illustrated in FIGS. 2A and 2B) which has the desired characteristics is manufactured, and this manufactured filter device is mounted on a test board formed as an actually used circuit, such as for example, the circuit of FIG. 4. Then, either one of the external leader terminals, for example, the terminal $13c(18c)$ is grounded. The output wave-form thus obtained may be a curve IV as in FIG. 5B. After that, another external leader terminal $13d(18d)$, is grounded. The output wave-form in this case may be a curve III, as in FIG. 5B. As will be obvious from the comparison of the curve III with the curve IV, the induction levels at the external leader terminals $13c(18c)$ and $13d(18d)$ are not necessarily equal; the curve III shows a better response (and hence less inductive coupling) than the curve IV. In this case, the induction level of the external leader terminal $13d(18d)$ should be increased. If the external leader terminal $13b$ is not grounded, the input and the output transducer 2 and 3 are electrically coupled as shown in FIG. 6B by using leading electrodes $11b$ and $11d$. The capacitance determined by the electrically conductive patterns 30 and 31 should be a value such that the difference in the level of induction is eliminated. As a result, the output wave-forms when the output terminals 13c(18c) and 13d(18d) are grounded become as represented by curves V and VI in FIG. 9A; i.e., the levels of induction coupling become equal to each other. In this case, the output wave-form of the differential amplifier 26 is represented by a curve VII in FIG. 9B. It will be recognized that the level of the skirt portions of curve VII is greatly reduced, i.e., the level of inductively coupled out-of-band signals is decreased as compared with the case of FIG. 5A. Here, the wave-form of the peak portion $P_1$ is as represented by a curve VIII in FIG. 9B, from which it will be understood that the pass-band ripples have disappeared. FIGS. 6B, 6D, 7B and 7D illustrate embodiments in which the leading electrode 11a is grounded, and FIGS. 6A, 6C and 7C illustrate embodiments in which the leader terminal 11b is grounded. FIGS. 6A, 6D, 7A and 7D illustrate constructions by which the induced level in the output terminal 3a (FIG. 3) is increased, and FIGS. 6B, 6C, 7B and 7C illustrate constructions by which the induced level in the output terminal 36 (FIG 3) is increased. As mentioned above, after determining the positions where the patterns 30 and 31 are to be formed, and the desired capacitance value of the coupling between the patterns 30 and 31, an exposure mask (not shown) for the manufacturing is formed, and the filter chip for the product is manufactured by a process such as that illustrated in FIGS. 8A, 8B and 8C. In the above-mentioned embodiments, one electrode of the input transducer 2 and one electrode of the output transducer 3 are coupled together, but the present invention is not limited to these embodiments. For example, by combining the embodiments illustrated in FIGS. 6A and 6B, that is, by coupling both electrodes of the input transducer 2 to the output transducer 3, and by adjusting the coupling capacitances, the induced level in the output terminals can be equalized.

The surface acoustic wave filter device according to a further embodiment of the present invention is discussed below with reference to FIGS. 10.

This embodiment is different from the afore-mentioned embodiment, and this embodiment is most suitable for applications such as in FIG. 2B when the filter chip is mounted in a molded case. The characteristic feature of this embodiment is the ease of manufacture, and this embodiment is preferably applied to a surface acoustic wave filter device mounted in a molded case.

In this embodiment, an electrically conductive film, comprising, for example, silver paste, or carbon paste is formed on the outer surface or an inner surface of the molded cap 19 illustrated in FIG. 2B, and the input terminal and the output terminal of the filter device are capacitatively coupled by this electrically conductive film. In this embodiment, it is found experimentally that the induced levels in the output terminals can be equalized and the induced signals can be cancelled by the differential amplifier 46.

Figure 10:
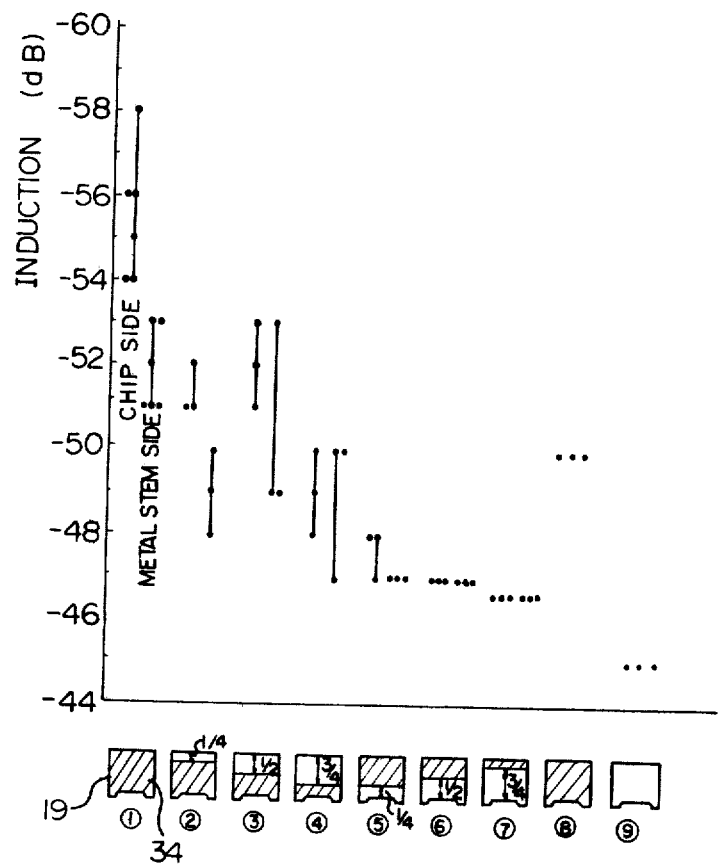
FIG. 10 is a diagram illustrating the principle of a surface acoustic wave filter device according to another embodiment of the present invention.

The experimental result of this embodiment is shown in FIG. 10. In FIG. 10, an electrically conductive film 34 of carbon paste (indicated by hatched lines) is formed on the surface of the molded cap 19, and the shape and area of the conductive film 34 is varied as shown by hatched lines, so that eight kinds of the molded caps 19 are manufactured. By using these molded caps 19, a filter device as illustrated in FIG. 2B is manufactured. This filter device is mounted in the circuit illustrated in FIG. 4, so as to measure the inductive coupling (dB) in the passband of the filter device.

Referring to FIG. 10, the ordinate represents an induced value, and the abscissa represents one of the above-mentioned eight kinds of molded caps 19. In the molded caps 19, having shapes designated by ① through ⑦ in FIG. 10, the induced values are measured with respect to two cases: when the electrically conductive film 34 is formed in front of the substrate 1 illustrated in FIG. 2B (hereinafter referred to as a chip side case); and, when the film 34 is formed in front of the metal stem 17 illustrated in FIG. 2B (hereinafter referred to as metal stem side case). In FIG. 10, the chip side cases are illustrated by vertical lines on the left sides and the metal stem cases are illustrated on the right sides of each of the columns above the molded caps 19 having shapes ① through ⑦. In the molded caps 19 having shapes ① through ⑦, the film 34 is formed on one side of the molded cap 19, whereas, in the molded cap 19 having a shape designated by ⑧, the film 34 is formed on the whole surface of both sides of the molded cap 19; that is, on both the chip side and the metal stem side (hereinafter referred to as both side case). Further in FIG. 10, in a molded cap designated by ⑨, no film 34 is formed on either side of the molded cap.

As is clear from the experimental results illustrated in FIG. 10, when the molded cap 19 of shapes ①, ② or ③ is used in the device, good band-pass characteristics results, having a value considerably better than −48 dB which is the nominal induced value required for an ordinary surface acoustic wave filter device. Further, a chip side case is more effective than a metal stem case, and when the molded cap 19 having the shape ④ is used, particularly good band-pass characteristic can be obtained if the film 34 is formed on the chip side. Further, as is clear from FIG. 10, the chip side case having a shape ①, ②, or ③ has better characteristics than the both side case having the shape ⑧.

When the molded cap 19 has the shape ③, the film 34 is formed down to the pad portions of the leading electrodes 11a, 11b, 11c, 11d, and when the molded cap 19 having the symbol ④, the film 34 is formed on the inner surface of the molded cap 19 near the external leader terminals 18a, 18b, 18c, 18d and 18e. Molded caps 19 having the shape ③ or ④ have better band-pass characteristics than a molded cap 19 having the shape ⑤, ⑥ or ⑦, in which no film 34 is formed near the external leader terminals. In the case of the molded cap 19 designated by ⑨, as the induction value is smaller than the shapes ① through ⑧, the good band-pass characteristics can not be obtained.

Figure 11A:
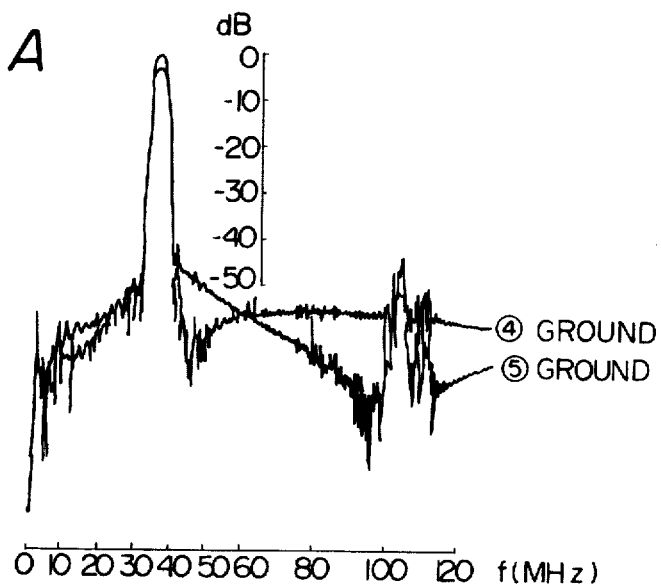
FIGS. 11A, 11B and 11C and FIGS. 12A, 12B and 12C are diagrams illustrating the frequency characteristics of a surface acoustic wave filter device according to the present invention in comparison with those of a conventional filter device.
Figure 11B:
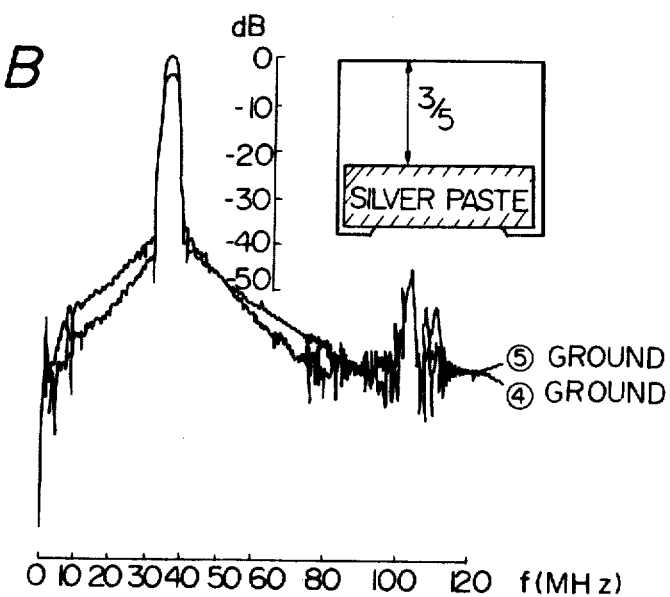
Figure 11C:
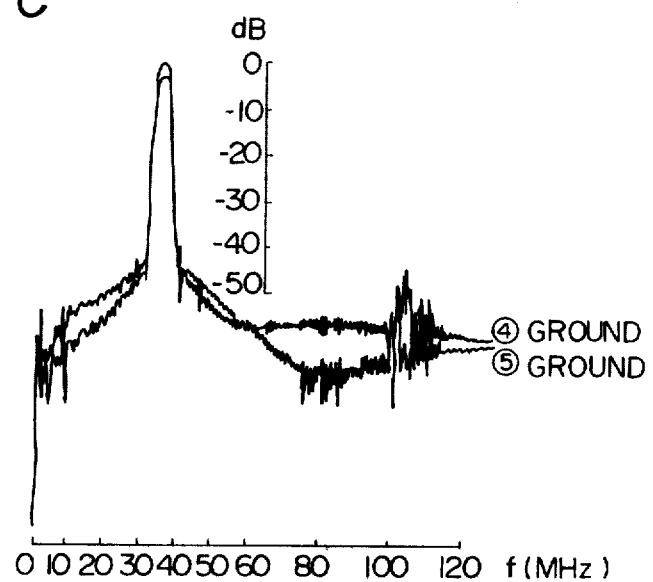
Figure 12A:
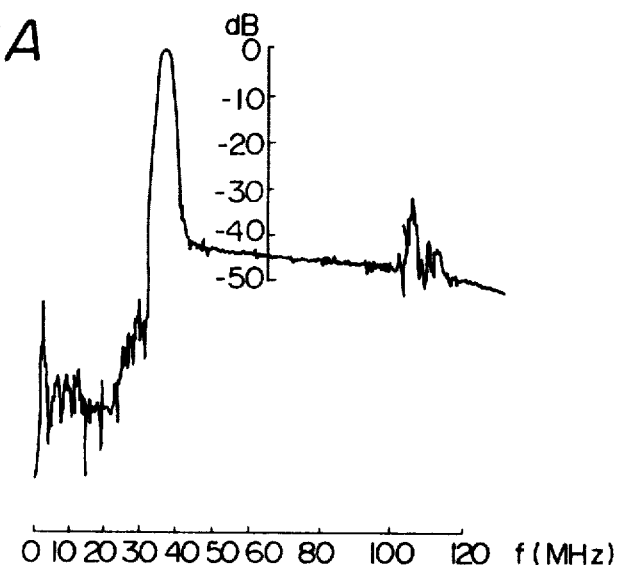
Figure 12B:
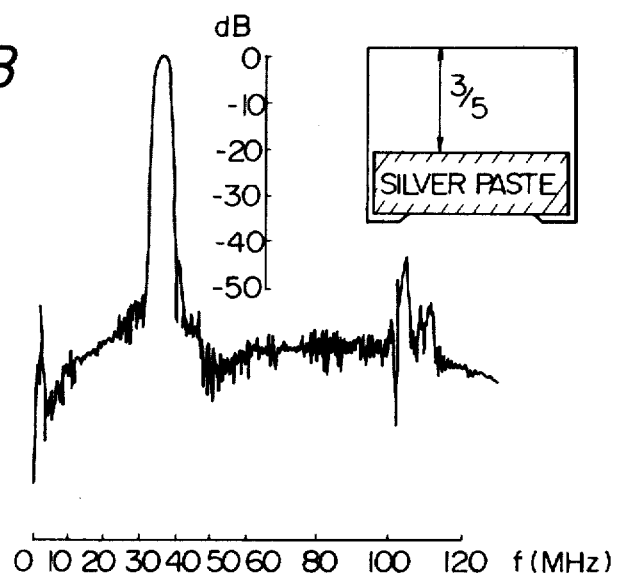
Figure 12C:
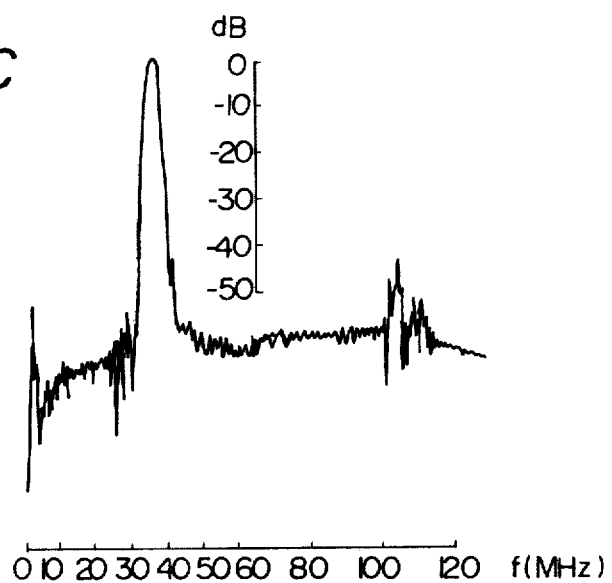

Below are compared the levels of induction (1) when no electrically conductive film is applied to a resin mold case, (2) when a mold case has an electrically conductive film of silver paste patterns on the chip side by the present invention, and (3) when electrically conductive film of the above-mentioned carbon paste is applied to the whole surface on the chip side of the filter by the present invention. FIGS. 11A, 11B, and 11C illustrate balance of frequency characteristics when the external leader terminals 13d(18d) or 13c(18c) in the measuring circuit of FIG. 4 are grounded; FIG. 11A represents the case when there is no electrically conductive film, FIG. 11B represents the case when there is a silver paste film at the terminal portions as shown in the inset, and FIG. 11C represents the case when the carbon paste film is applied to the whole surface of the casing on the side of the filter chip. Referring to FIG. 11A it is clear that the degree of balance is not very good. However, in the filter device of the present invention having the characteristics shown in FIGS. 11B and 11C, it is found that the inductance value is increased by the electrically conductive film, and the degree of balance is improved. FIGS. 12A, 12B and 12C illustrate wave-forms of balanced outputs which appear across the external leader terminals 13d(18d) and 13c(18c) and which correspond to the cases of FIGS. 11A, 11B and 11C, respectively. With reference to FIG. 12C, the characteristics at frequencies smaller than 40 MHz are hardly different from those of FIGS. 12A and 12B, but exhibit a smoothly descending curve at frequencies greater than 40 MHz.

FIG. 13 illustrates a further embodiment of the present invention. In this embodiment, when the electrically conductive film 34, comprising, for example, silver paste or carbon paste is printed on the molded cap 19, a label such as the name, for example, of a filter device is also printed and formed by using a thermosetting process. In this case, no special process for forming the label is required so that the cost of the article can be reduced.

According to the present invention as illustrated in the foregoing embodiments, the induction caused in the filter or the circuit using the filter can be suppressed in the filter device, so that the level of induction can be decreased to minimize the ripples, thereby improving the passing and blocking characteristics of the filter. Moreover, the electrically conductive patterns which constitute the capacitor element can be formed simultaneously with the formation of interdigital electrodes of the acoustic surface wave filter device or can also be used as means for labelling on the molded cap. According to the present invention, therefore, the acoustic surface wave filter device can be simply and easily constructed at a reduced manufacturing cost.

What is claimed is:

1. A surface acoustic wave filter device, comprising:
   a filter chip comprising an input transducer and an output transducer, each composed of a pair of interdigitated electrodes and formed on a piezo-electric substrate;
   a casing in which said chip is mounted;
   a plurality of externally leading input and output terminals, said terminals being connected to said chip and leading through said casing, said input terminals being connected to said input transducer and said output terminals being connected to said output transducer;
   a balanced-type differential amplifier connected to said output transducer through said externally leading output terminals;
   means for capacitatively coupling at least one of said input terminals with at least one of said output terminals, thereby to equalize the level of signals which are induced on said output terminals of said output transducer without having assumed the form of surface acoustic waves.

2. A surface acoustic wave filter device as set forth in claim 1, wherein said coupling means comprises:
   a first electrically conductive pattern which extends, from at least one of said input terminals of said input transducer, along said piezo-electric substrate of said chip; and
   a second electrically conductive pattern which extends, from at least one of said output terminals, along said piezo-electric substrate;
   wherein said first and second patterns are shaped and located to provide capacitative coupling therebetween.

3. A surface acoustic wave filter device as set forth in claim 2, wherein said electrically conductive patterns are formed simultaneously with the formation of said transducers.

4. A surface acoustic wave filter device as set forth in claim 1, wherein said casing comprises a synthetic resin, and said coupling means comprises a metallic layer, disposed on said casing, which lies above at least one of said input terminals near said input transducer and at least one of said output terminals near said output transducer, so that said respective input and output terminals are capacitatively coupled together by said metallic layer.

5. A surface acoustic wave filter device as set forth in claim 4, wherein said metallic layer is located on the front surface or back surface respectively of said casing, in opposition to said transducers of said filter chip.

6. A surface acoustic wave filter device as set forth in claim 5, wherein said metallic layer is formed by printing onto the surface of said casing an electrically conductive paste.

7. A surface acoustic wave filter device as set forth in claim 6, wherein said electrically conductive paste is a silver paste.

8. A surface acoustic wave filter device as set forth in claim 6, wherein said electrically conductive paste is a carbon paste.

9. A surface acoustic wave filter device as set forth in claim 6, wherein indication markings are formed by printing on the surface of said casing simultaneously with the formation of said metallic member by applying said electrically conductive paste.

* * * * *